(12) United States Patent
Ji

(10) Patent No.: US 9,071,229 B1
(45) Date of Patent: Jun. 30, 2015

(54) MINIATURE MULTI-DECADE GHZ BALUN

(71) Applicant: Daxiong Ji, Brooklyn, NY (US)

(72) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 157 days.

(21) Appl. No.: 13/954,228

(22) Filed: Jul. 30, 2013

(51) Int. Cl.
*H03H 7/42* (2006.01)
*H03H 7/48* (2006.01)

(52) U.S. Cl.
CPC ........................................ *H03H 7/42* (2013.01)

(58) Field of Classification Search
CPC .................. H03H 7/42; H03H 7/48
USPC ........................................ 333/25, 32, 131
See application file for complete search history.

(56) References Cited

U.S. PATENT DOCUMENTS

| | | | |
|---|---|---|---|
| 4,275,365 A * | 6/1981 | Ando | 333/131 |
| 5,060,298 A | 10/1991 | Waugh et al. | |
| 5,379,006 A | 1/1995 | McCorkle | |
| 5,523,728 A | 6/1996 | McCorkle | |
| 5,742,213 A * | 4/1998 | Reynolds | 333/131 |
| 5,767,754 A * | 6/1998 | Menna | 333/25 |
| 6,108,529 A | 8/2000 | Vice et al. | |
| 6,239,668 B1 * | 5/2001 | Menna et al. | 333/25 |
| 6,275,687 B1 | 8/2001 | Lloyd | |
| 6,278,340 B1 | 8/2001 | Liu | |
| 6,343,211 B1 | 1/2002 | Thodesen et al. | |
| 6,348,830 B1 | 2/2002 | Rebeiz et al. | |
| 6,427,069 B1 | 7/2002 | Galin | |
| 6,438,563 B1 | 8/2002 | Kawagoe | |
| 6,531,943 B2 | 3/2003 | Niu et al. | |
| 6,587,699 B2 | 7/2003 | Olsen et al. | |
| 6,611,696 B2 | 8/2003 | Chedester et al. | |
| 6,665,546 B2 | 12/2003 | Slaughter et al. | |
| 6,714,800 B2 | 3/2004 | Johnson et al. | |
| 6,806,790 B2 * | 10/2004 | Ji | 333/119 |
| 6,807,407 B2 | 10/2004 | Ji | |
| 6,917,796 B2 | 7/2005 | Setty et al. | |
| 6,963,255 B2 * | 11/2005 | Zheng et al. | 333/131 |
| 7,027,795 B2 | 4/2006 | Ji | |
| 7,072,636 B2 | 7/2006 | Dobrovolny | |
| 7,095,998 B2 | 8/2006 | Tatsumi et al. | |
| 7,250,828 B2 | 7/2007 | Erb | |
| 7,292,837 B2 | 11/2007 | Tatsumi et al. | |
| 8,064,870 B2 | 11/2011 | Kuo et al. | |

(Continued)

OTHER PUBLICATIONS

David E. Meharry, Decade Bandwidth Planar MMIC Balun, BAE Systems Electronic & Integrated Solutions, Nashua, NH, IEEE 2006, 4 pages.

*Primary Examiner* — Dean Takaoka
(74) *Attorney, Agent, or Firm* — Lawrence G. Fridman

(57) ABSTRACT

A miniature wideband balun is realized wherein a miniature rectangular high permeability ferrite binocular core is wound with a single wire on the first of three legs and a twisted pair of wires on the third of three legs. Each winding is configured from 36 gauge wire to include two turns with precise positioning and spacing on the legs, and precise control over the length and position of the non-wound wire portions. The non-wound wire portions have their ends welded to the conductive terminals of a flat insulating substrate which the core is bonded to. Such an approach results in a wideband response of from 10 MHz to at least 6000 MHz with a substantially flat insertion loss and a low return loss. Additionally, a lid is bonded to the top of the core in order to form a package conducive to handling by standard pick and place robotic assembly machinery.

19 Claims, 11 Drawing Sheets

(56) References Cited

U.S. PATENT DOCUMENTS

| | | |
|---|---|---|
| 8,064,871 B2 | 11/2011 | Kuo et al. |
| 8,112,058 B2 | 2/2012 | Kuo et al. |
| 8,228,154 B2 | 7/2012 | Liu et al. |
| 8,498,604 B2 | 7/2013 | Jiang et al. |
| 8,576,037 B1 * | 11/2013 | Ji .................................. 336/148 |
| 2009/0221258 A1 | 9/2009 | Steinbuch |
| 2010/0015941 A1 | 1/2010 | Jeong et al. |
| 2010/0081409 A1 | 4/2010 | Kuo et al. |
| 2011/0312295 A1 | 12/2011 | Jiang et al. |

* cited by examiner

MINIATURE MULTI-DECADE GHZ BALUN

BACKGROUND OF THE INVENTION

1. Field of the Invention

The present invention relates to a wideband transformer/balun and more particularly, to a miniature wideband transformer/balun having a bandwidth of multiple decades. Such transformers find application in high frequency mixer circuits.

2. Description of the Prior Art

This invention generally relates to transformer/baluns surface mounted on printed circuit boards and more particularly to baluns for use with high frequency mixer circuits for converting balanced ports to unbalanced ports. The word balun comes from combining the words "BALanced" and "UNbalanced". A typical high frequency mixer circuit may be realized as a Monolithic Microwave Integrated Circuit, (MMIC) which is a type of integrated circuit (IC) device that operates at microwave frequencies (300 MHz to 300 GHz).

In a typical high frequency mixer application, each of the RF and LO differential ports should ideally be driven through a balun for optimal performance. Some MMIC mixers have an operation range of 10 MHz to 6 GHz. Lacking a single broadband balun, as many as three baluns would be needed to cover this frequency range, with each having an individual mechanical footprint and therefore each needing an individual pc board layout. This becomes unacceptable for miniaturized wideband applications.

In general, industry uses LTCC or semiconductor technology for high frequency designs, (above 0.5 GHz) but these technologies have limitations. A first limitation is that the low frequency performance is constrained by the physical size of the device. A second limitation is that the bandwidth of an LTCC or semiconductor design cannot currently be multi-decade; it is at best multi-octave.

U.S. Pat. No. 5,523,728 entitled MICROSTRIP DC TO GHZ FIELD STACKING BALUN teaches a pc board based balun that maintains low insertion loss and good balance for ultra wide band (DC-to-Ghz) applications. These results are achieved using a balun structure formed by microstrip lines on a dielectric substrate. While the claimed bandwidth is considerable, the upper frequency limit is not explicitly stated. The lower frequency operation also requires the use of multiple ferrite cores. Further, the balun is relatively large and either occupies a dedicated area on a pc board or is fabricated as a discrete pc board which must then be handled and assembled into a still larger circuit.

U.S. Pat. No. 5,379,006 entitled WIDEBAND (DC TO GHZ) BALUN teaches a balun that maintains low insertion loss and good balance for ultra wide band applications. While the claimed bandwidth is considerable, the upper frequency limit is not explicitly stated. The lower frequency operation also requires the use of multiple ferrite cores. This balun also requires relatively long transmission lines to be fabricated, and in the forms disclosed will require a complex mounting or support structure.

U.S. Pat. No. 7,205,861 entitled BALUN DEVICE teaches a wideband balun fabricated from tuned LC networks. However, the stated bandwidth for this balun is only 3 GHz to 10 GHz, not even a full decade and completely lacking in the lower frequency range.

U.S. Pat. No. 7,250,828 entitled COMPACT BALUN teaches a distributed backwards-wave balun comprising pairs of coupled transmission lines. However, this patent fails to disclose either the resulting dimensions or the usable frequency range for the balun.

U.S. Pat. No. 6,531,943 entitled BALUN-TRANSFORMER teaches a balun fabricated from a chemically etched conductor-backed coplanar waveguide connected to a conductor-backed coplanar stripline, and including an impedance matching circuit. The claimed bandwidth is from several MHz to 10 GHz, but the structure requires highly specialized processing and is potentially unacceptably large.

U.S. Pat. No. 6,278,340 entitled MINIATURIZED BROADBAND BALUN TRANSFORMER HAVING BROADSIDE COUPLED LINES teaches a miniaturized wideband multi-layer balun. This balun is fabricated from multiple layers of metalized dielectric substrates, and is only analyzed over a frequency range of 1.6 GHz to 2.4 GHz.

U.S. Pat. No. 8,228,154 entitled MINIATURIZED WIDEBAND BALUNS FOR RF APPLICATIONS teaches a balun having a bandwidth of 800 MHz to 6 GHz, designed to be fabricated using semiconductor technologies. While this balun offers the advantage of being potentially integrated directly into a larger integrated circuit, it is lacking adequate lower frequency response and requires all the complexity of a semiconductor fabrication line in order to be made.

A paper entitled *Decade Bandwidth Planar MMIC Balun* published in the Microwave Symposium Digest in 2006 teaches a balun operating over a 2 GHz to 20 GHz frequency range by connecting low and high band baluns to three diplexer filters which are used as input and output conditioning devices. While small in size, this balun fails to operate at lower frequencies.

Many of the prior art baluns discussed herein use ferrite cores, which are generally round. Conventional binocular ferrite cores have round edges and round apertures. When magnet wire is wound with spacing between turns on these rounded shapes it will tend to move during and after winding, thereby reducing the coil precision and inducing electrical parameter variation.

A more capable balun would provide a frequency range of 10 MHz to 6,000 MHz or higher, with a substantially flat insertion loss and a low return loss with minimal parameter variation between units while having a highly miniaturized form factor, be fabricated out of readily available materials, and be surface mountable using standard robotic pick and place machinery.

SUMMARY OF THE INVENTION

In the present invention, a balun is realized wherein a miniature binocular core is wound with a single wire on the first of three legs and a twisted pair of wires on the third of three legs. The core is rectangular in form and made of a high permeability ferrite material. Each winding is configured from 36 gauge wire to include approximately two turns with precise positioning and turn spacing of approximately two wire diameters on the legs, and precise control over the length and position of the non-wound wire portions. The twisted pair of wires is twisted to 20 twists per inch with a twist deviation of no more than 5 percent. The non-wound wire portions have their ends welded to the conductive metal bonding pad terminals of a flat substrate to which the core is bonded. Such an approach results in a wideband response of from 10 MHz to at least 6000 MHz with a substantially flat insertion loss and a low return loss.

Additionally, a lid is bonded to the top of the core in order to form a package conducive to handling by standard pick and place robotic assembly machinery.

The balun hereof occupies a volume that is approximately 0.16 inch×0.15 inch×0.16 inch.

OBJECTS AND FEATURES OF THE INVENTION

It is an object of the present invention to provide a 1:1 50 Ohm unbalanced to 50 Ohm balanced multi-decade balun having at least a 10 MHz to 6000 MHz bandwidth with a substantially flat insertion loss and a low return loss.

It is another object of the present invention to provide repeatable performance between assembled baluns.

It is still another object of the present invention to have a footprint of approximately 0.16 inch×0.15 inch×0.16 inch.

It is yet another object of the present invention to be surface mountable with standard automated pick and place equipment.

It is a feature of the present invention to have all wires wound on a single, miniature, high permeability, ferrite, binocular core.

It is another feature of the present invention to utilize a rectangular binocular core.

It is still another feature of the present invention that wire coil gauge, twist, spacing and position are carefully controlled in order to maximize usable bandwidth and minimize signal losses.

BRIEF DESCRIPTION OF THE DRAWINGS

The present version of the invention will be more fully understood with reference to the following Detailed Description in conjunction with the drawings of which.

DESCRIPTION OF THE PREFERRED EMBODIMENT AND BEST MODE

Figure 1A:
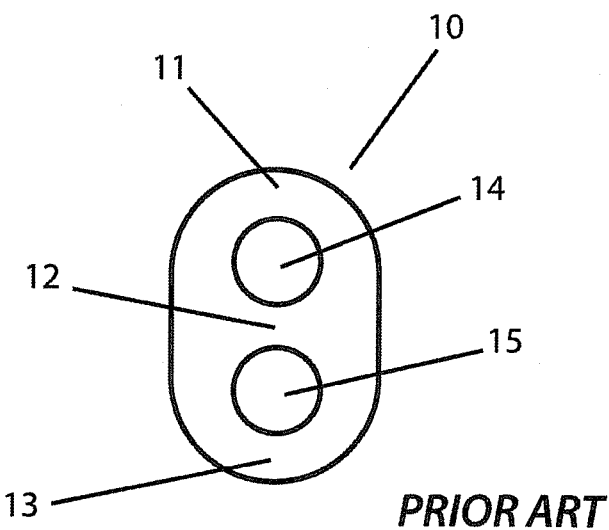
FIG. 1a shows a side elevation view of a prior art rounded binocular core.
Figure 1B:
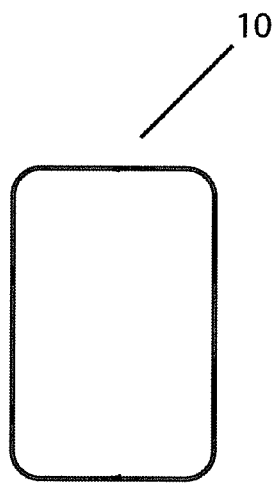
FIG. 1b shows a plan view of a prior art rounded binocular core.

FIG. 1a shows a prior art binocular core 10 with the standard curved first leg 11, second leg 12, curved third leg 13, round first aperture 14 and round second aperture 15. FIG. 1b shows the side thickness of the prior art binocular core 10. One disadvantage of this prior art binocular core 10 is that any coils wound with spacing between the turns on the curved legs are likely to shift position, and will not maintain a desired coil turn spacing without adhesives, potting or similar means. This produces a significant limitation for coil performance.

Figure 2A:
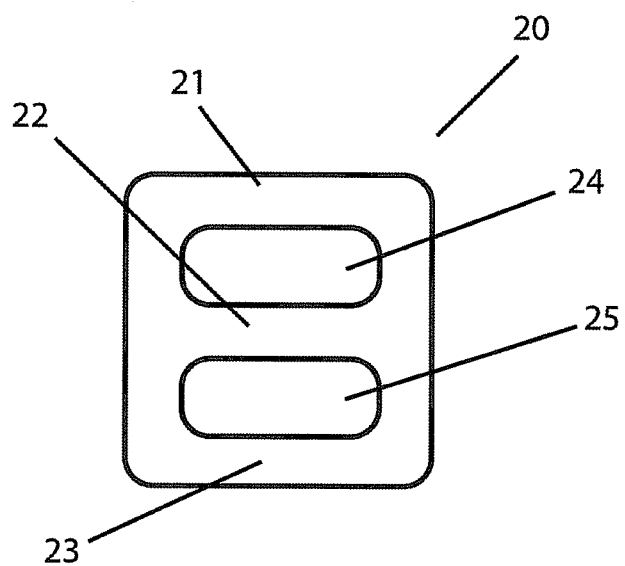
FIG. 2a shows a side elevation view of a rectangular binocular core.
Figure 2B:
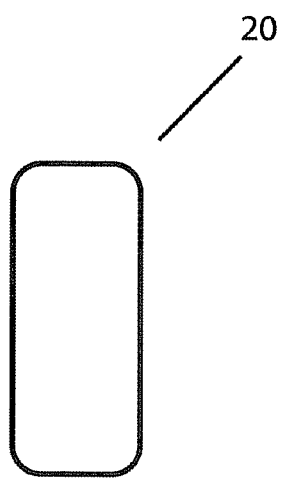
FIG. 2b shows a plan view of a rectangular binocular core.

FIG. 2a shows a rectangular binocular core 20 with a straight first leg 21, second leg 22, curved third leg 23, rectangular first aperture 24 and rectangular second aperture 15. FIG. 2b shows the reduced side thickness of the rectangular binocular core 20. The straight side legs and reduced side thickness of the rectangular binocular core 20 permit precise control over coil location and coil turn spacing, thereby providing a coil with significantly improved frequency response. The rectangular binocular core 20 is also made of a high permeability ferrite and is of extremely miniature size, approximately 0.086"×0.080"×0.040". The preferred relative permeability (the ratio of the permeability of a specific medium to the permeability of free space) is approximately 10,000 which enables low frequency operation. In general, the smaller the ferrite core, the higher the potential frequency operation. High permeability cores are generally used for low frequency operation. Core manufacturers test the cores at very low frequencies, typically 100 kHz, and characterize them to a few MHz but never to GHz frequencies. Therefore, circuit designers generally do not use these cores at higher frequencies. The entire assembled balun is approximately 0.160"×0.150"×0.160".

Figure 3:
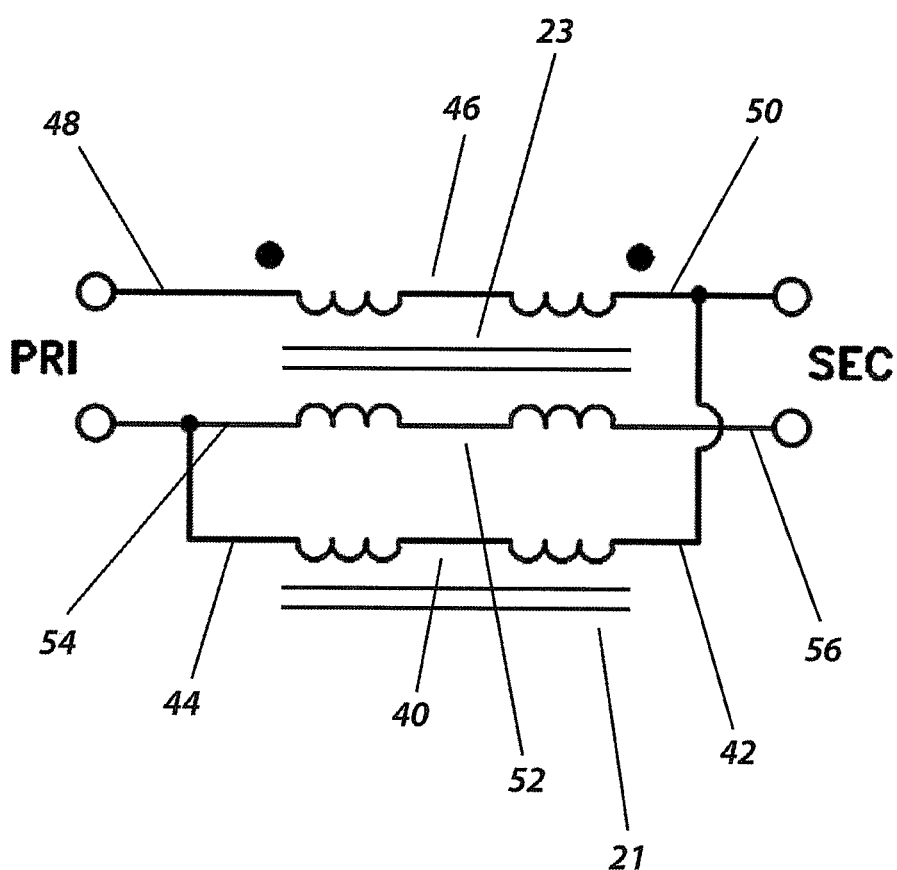
FIG. 3 shows a circuit diagram of the balun.
Figure 4A:
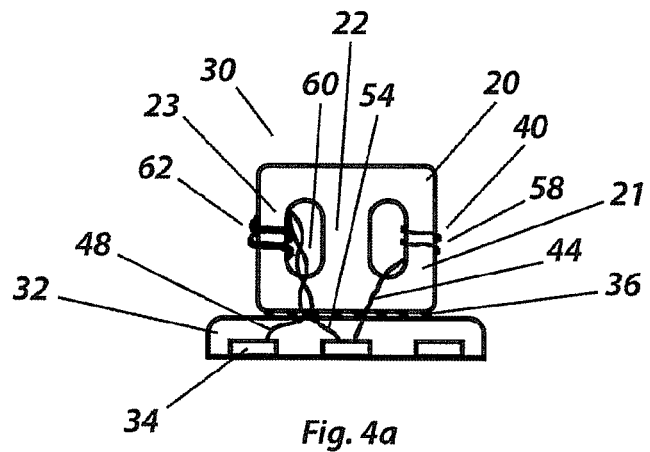
FIG. 4a shows a first side elevation view of the balun attached to a substrate.
Figure 4B:
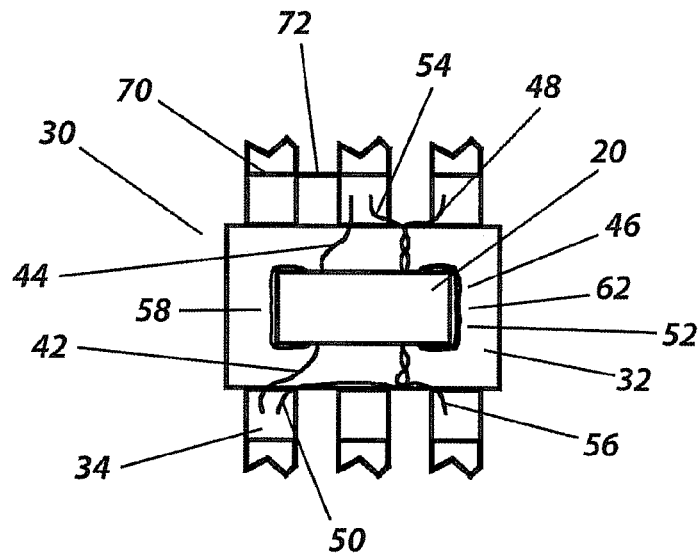
FIG. 4b shows a plan view of the balun attached to a substrate.
Figure 4C:
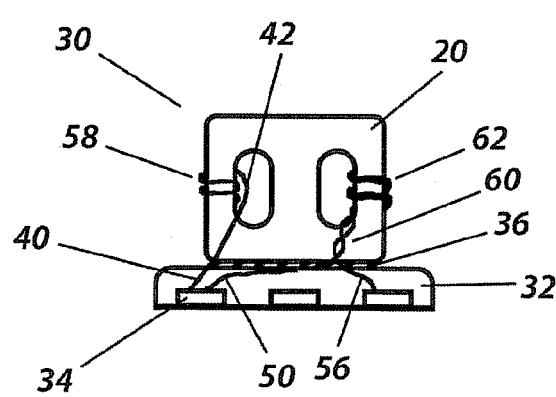
FIG. 4c shows a second side elevation view of the balun attached to a substrate.

FIG. 3 shows the circuit diagram for the balun of the present invention, which is explained in FIGS. 4a, 4b and 4c.

FIGS. 4a, 4b and 4c show the miniature balun and substrate assembly 30. The assembly consists of the miniature rectangular core 20 with a single wire coil 58 and a twisted pair coil 62, attached to a substrate 32. The single wire coil 58 is made from a first wire 40 having an upper wire end 42 and a lower wire end 44. The single wire coil 58 is substantially centrally wound around the first leg 21. The twisted pair coil 62 is made from a second wire 46 and a third wire 52, twisted together at 20 twists per inch for the twisted pair 60 portion of their length as shown. The second wire 46 has an upper wire end 48 and a lower wire end 50, and the third wire 52 has an upper wire end 54 and a lower wire end 56. The twisted pair coil 62 is substantially centrally wound around the third leg 23. The substrate 32 preferably has a plastic insulating body and conductive metal bonding pads 34 which the wires are bonded to, preferably by welding. The rectangular core 20 is preferably fastened to the substrate 32 by an adhesive such as chipbonder adhesive 36. The substrate 32 is processed in a fashion that benefits from the bonding pads 34 being trimmed to length towards the end of fabrication, and thus score lines 70 are included in the bonding pads 34. An orientation tab 72 is optionally included between two bonding pads in order to provide visual orientation of the balun during pick and place assembly into a larger circuit. The substrate 32 preferably has a glass fiber reinforced plastic body molded around metal bonding pads 34. Welded wire connections reduce parasitic inductance between the binocular core and an assembled circuit board.

Figure 5A:
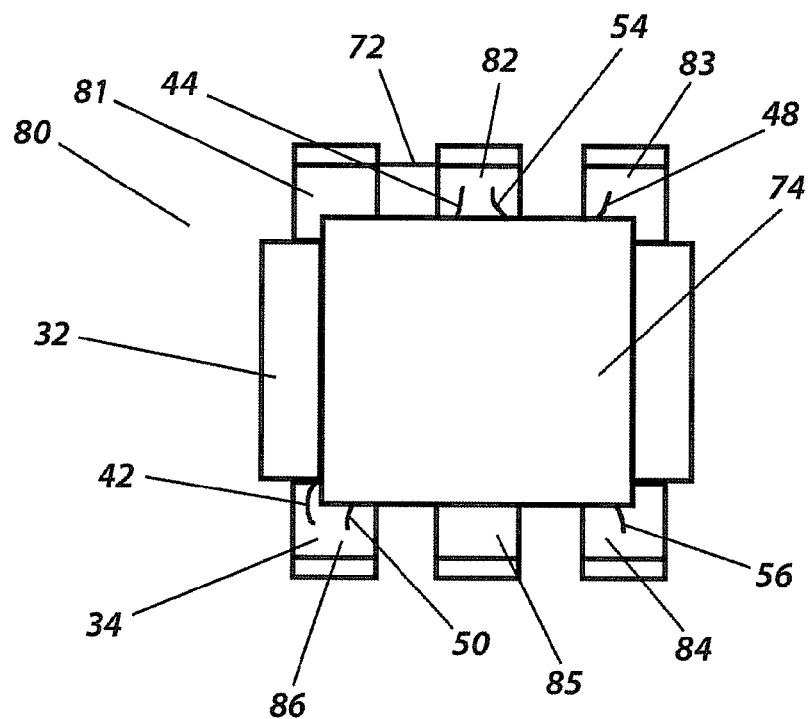
FIG. 5a shows a plan view of the assembled balun.

Referring to FIG. 5a, the first bonding pad 81 and fifth bonding pad 85 are not used and are generally connected to ground. The balun circuit is realized by connecting together the first wire lower end 44 and the third wire upper end 54 at the second bonding pad 82, and the first wire upper end 42 and the second wire lower end 50 at the sixth bonding pad 86. The single wire coil 58 and the twisted pair coil 62 are each approximately two turns, and both preferably have a coil turn spacing of two wire diameters. The non-coil portions of the wires are all led away from the binocular core 20 to minimize parasitic effects.

The second wire upper end 48 is bonded to the third bonding pad 83, and the third wire lower end 56 is bonded to the fourth bonding pad 84. The second bonding pad 82 is preferably connected to ground for the unbalanced side of the balun circuit, identified as Primary in FIG. 3. The wire used in the present invention is preferably 36 gauge. Likewise, 20 twists per inch is a tighter twist than is normally used for balun winding, but this high twist rate keeps the two wires together and prevents them from separating during core winding and rest of the manufacturing process. This high twist rate also increases coupling essential for high frequency operation. In general, high twist rate is not used for low frequency designs. No more than 5% twist deviation should be present in order to achieve the desired frequency response parameters. The non-twisted end portions of said twisted pair are configured to minimize parasitic inductance, since untwisted wire pairs at high frequencies can act as inductors and degrade signal performance.

Small ferrite cores have very small openings through which magnet wires need to be wound. This is a labor intensive process and very difficult to automate, leading to a requirement for a cost-effective manual winding process which will yield sufficiently accurate and repeatable results. Great care must be taken in the coil winding and assembly process in order to maintain coil locations, coil turn spacings, wire twist count and regularity, configuration of un-twisted wires and wire sections not part of coils, and the quality and consistency of welded wire joints at the pads. All of these factors, including the use of rectangular cores, 20 twist per inch wire pairs, and the carefully controlled winding spacings and non-coil wire positionings, all of which are counter to industry standard practices, contribute to the multi-decade frequency range and to the quality of the balun frequency response.

Figure 5B:
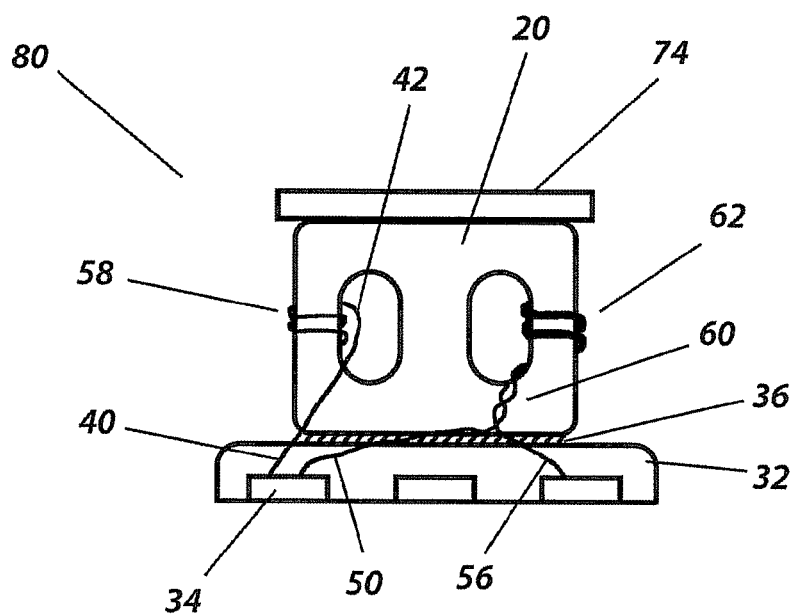
FIG. 5b shows a side elevation view of the assembled balun.

FIG. 5*a* and FIG. 5*b* further show the fully assembled balun 80 including a lid 74 which is used to facilitate automated pick and place robotic assembly. The lid 74 is attached to the binocular core 20 after coil winding and substrate 32 attachment.

Figure 6A:
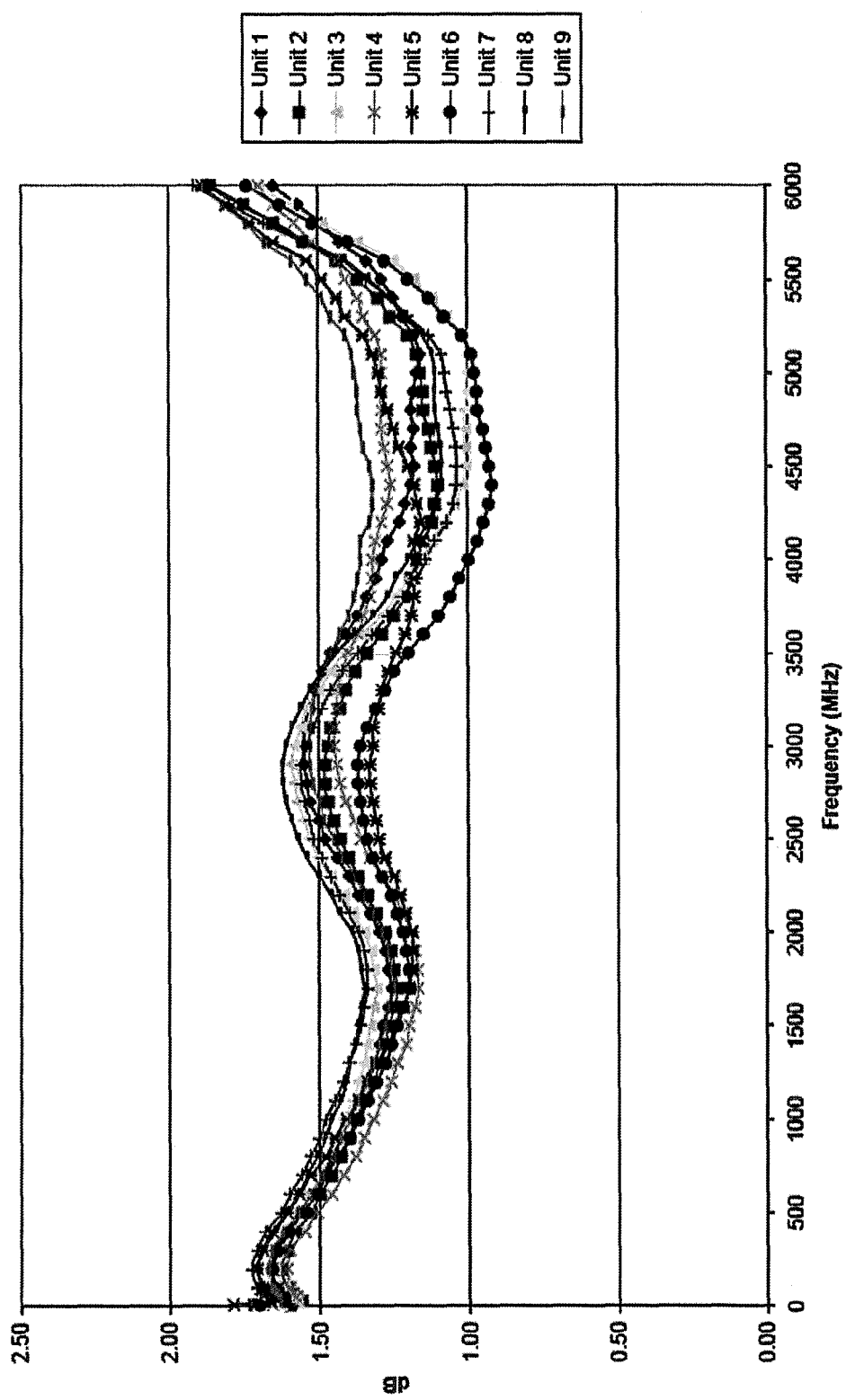
FIG. 6a shows a graph of insertion loss vs. frequency for nine baluns.
Figure 6B:
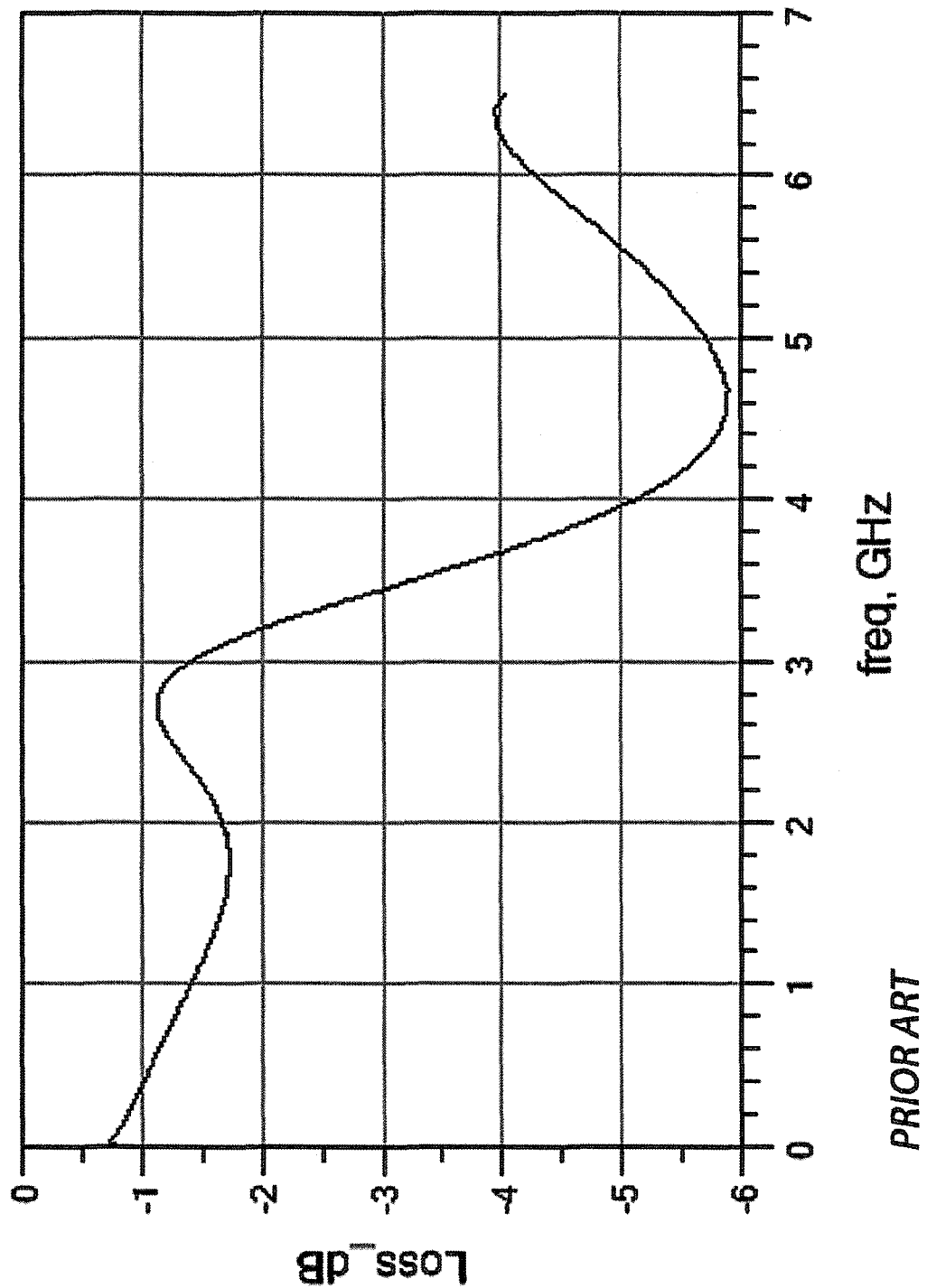
FIG. 6b shows a graph of insertion loss vs. frequency for a prior art balun.

FIG. 6*a* shows insertion loss vs. frequency for nine baluns of the present invention. The insertion loss of the present invention is shown to be less than 2 dB over the entire frequency band, and flatness of +/−0.5 dB. In comparison, FIG. 6*b* shows the prior art insertion loss to be as high as 5.8 dB and the prior art flatness to be +/−2.5 dB.

Figure 7A:
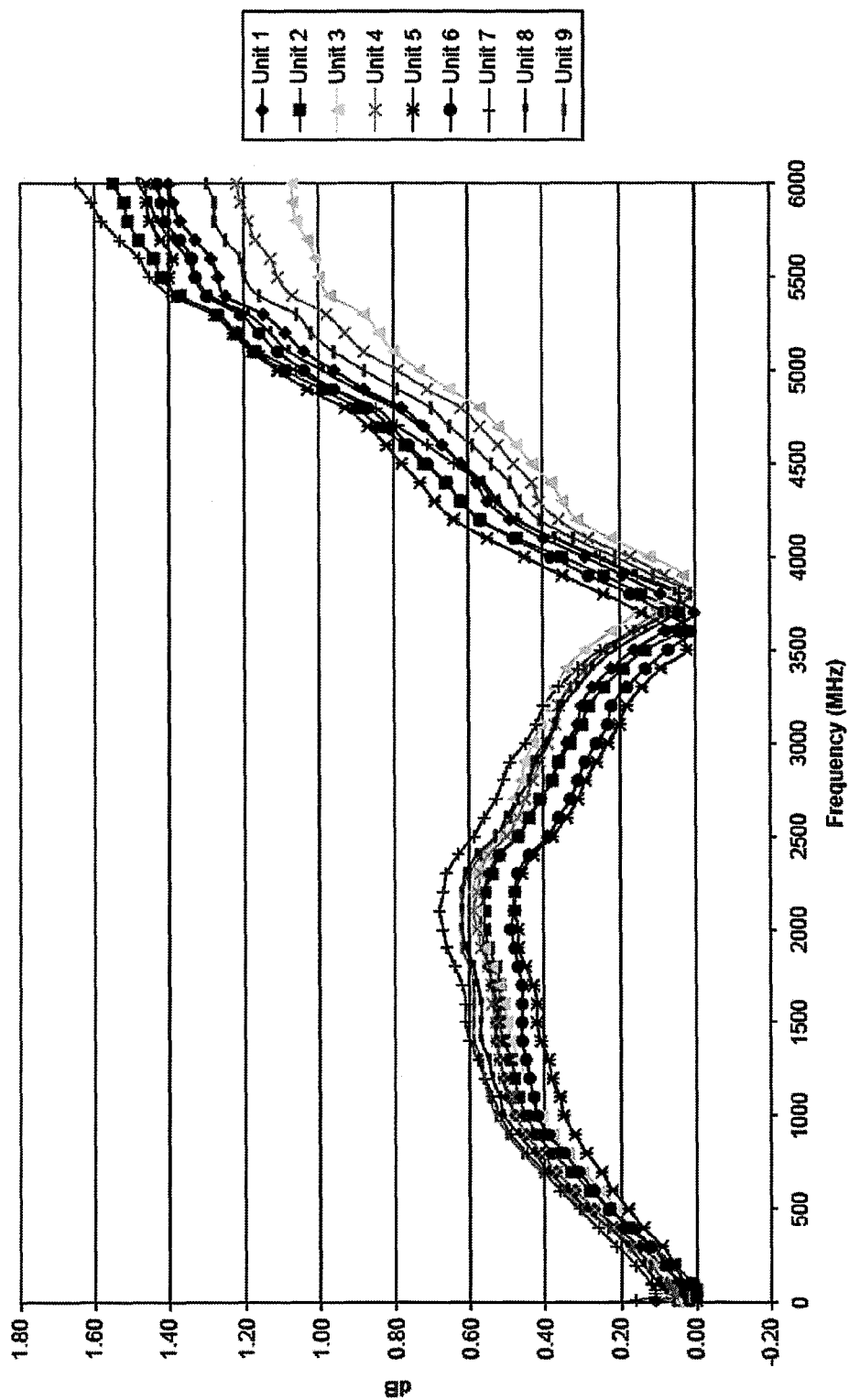
FIG. 7a shows a graph of amplitude unbalance vs. frequency for nine baluns.
Figure 7B:
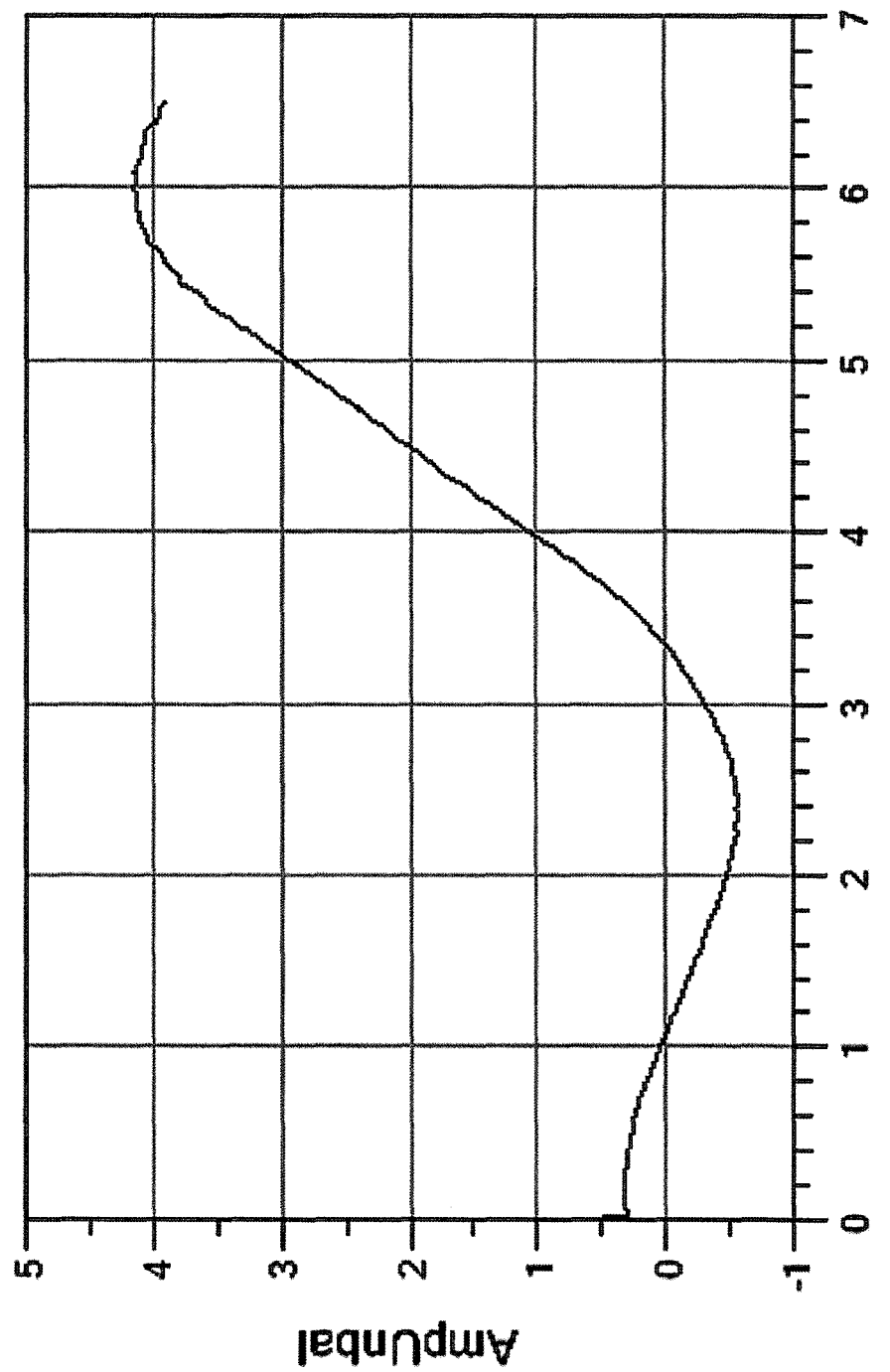
FIG. 7b shows a graph of amplitude unbalance vs. frequency for a prior art balun.

FIG. 7*a* shows amplitude unbalance vs. frequency for nine baluns of the present invention. The amplitude unbalance of the present invention is shown to be no more than 1.7 dB, while in comparison FIG. 7*b* shows the prior art amplitude unbalance to be as high as 4 dB.

Figure 8A:
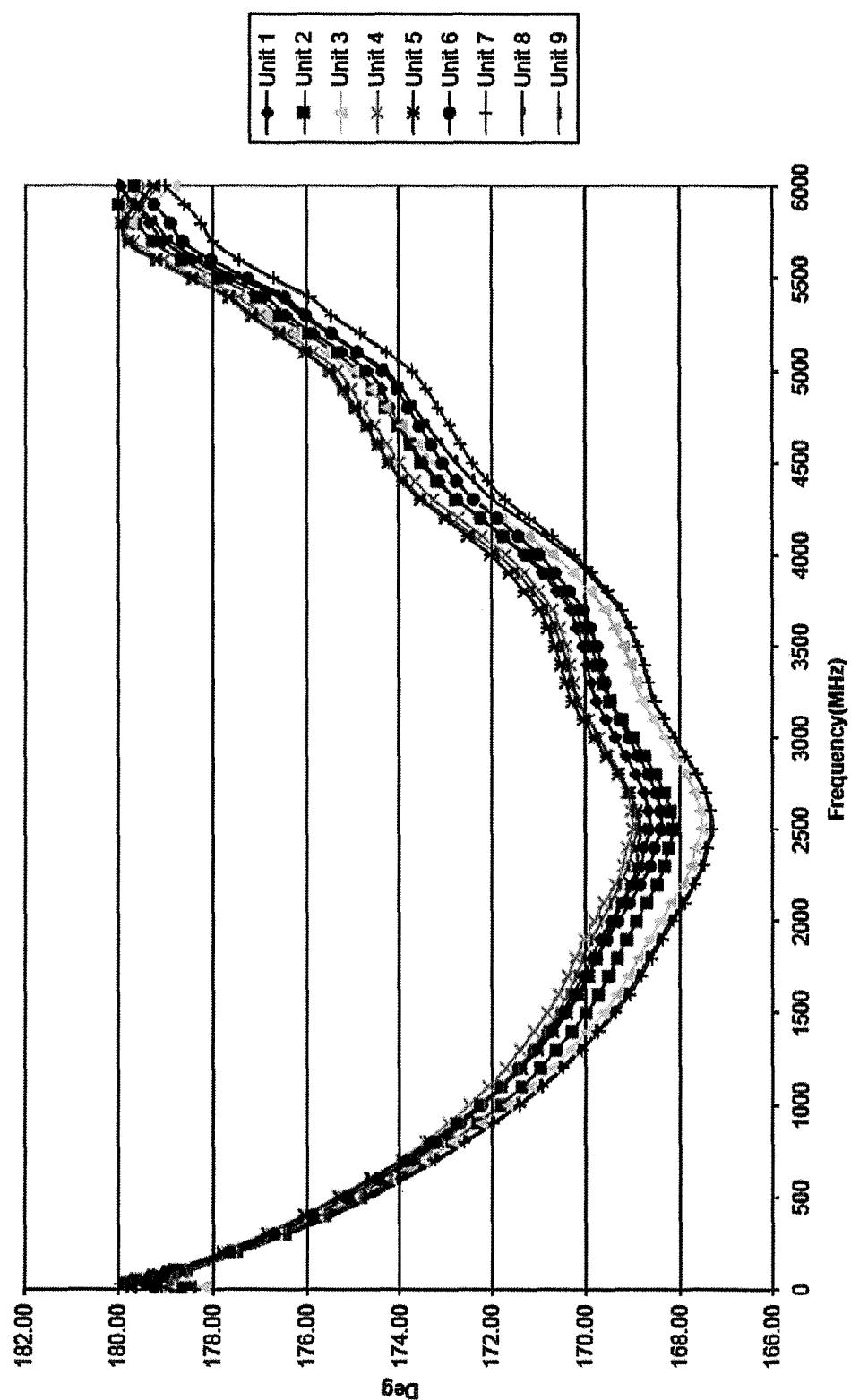
FIG. 8a shows a graph of phase unbalance vs. frequency for nine baluns.
Figure 8B:
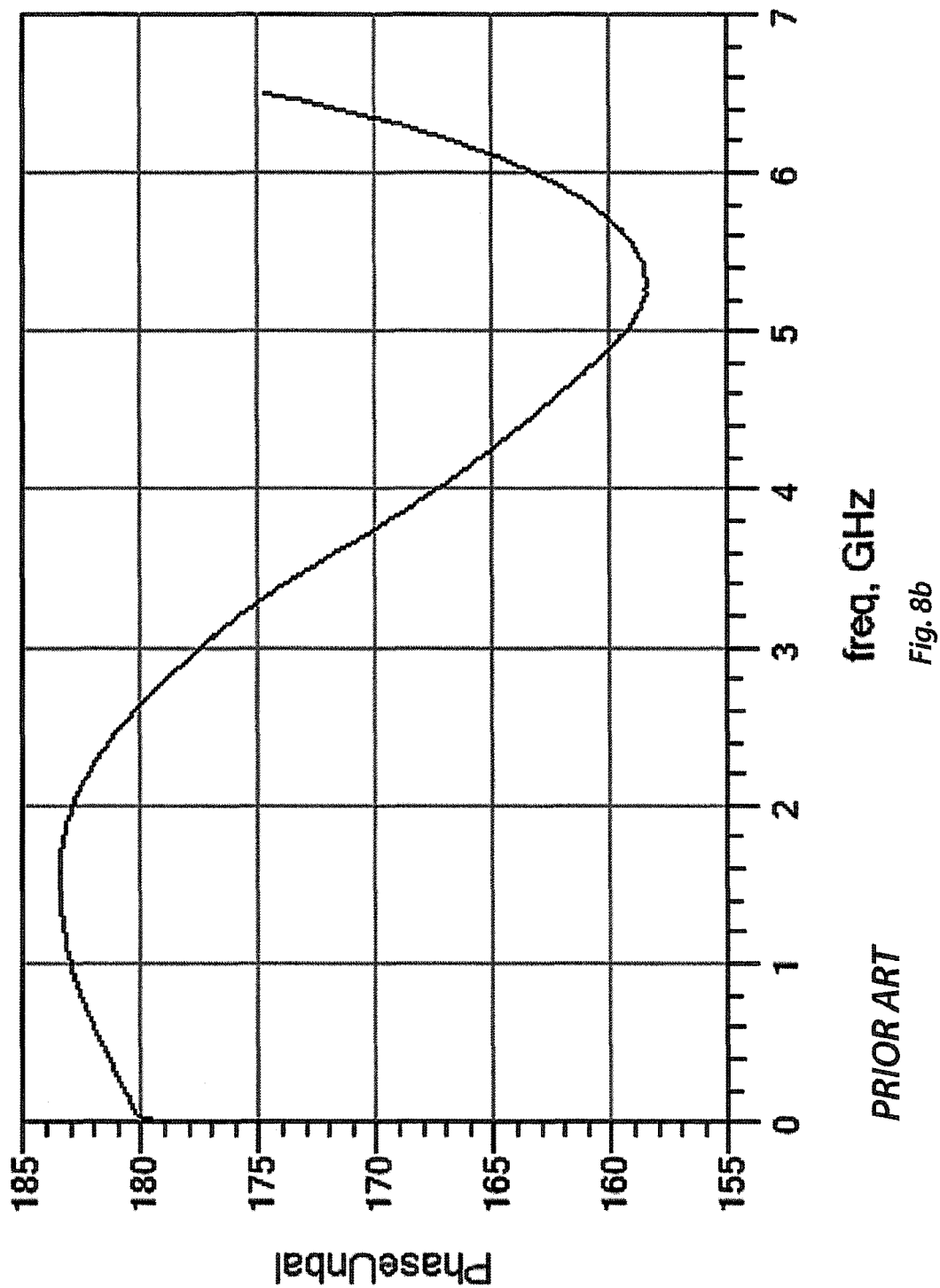
FIG. 8b shows a graph of phase unbalance vs. frequency for a prior art balun.

FIG. 8*a* shows phase unbalance vs. frequency for nine baluns of the present invention. The phase unbalance of the present invention in reference to 180° is no more than 13°, while in comparison FIG. 8*b* shows the prior art phase unbalance to be as high as 22°.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A miniature multi-decade balun comprising:
a miniature binocular core having a first leg, a second leg, a third leg, a first aperture and a second aperture;
said second leg being a center leg of said binocular core;
a first wire;
a twisted pair comprising a second wire and a third wire and having a central twisted portion and a non-twisted portion at each end;
said first wire being wound around said first leg and through said first aperture; and,
said twisted pair being wound around said third leg and through said second aperture.

2. A miniature multi-decade balun as described in claim 1, wherein:
said first wire has a first upper end and a first lower end;
said second wire has a second upper end and a second lower end;
said third wire has a third upper end and a third lower end;
said first lower end is electrically connected to said second upper end; and,
said first upper end is electrically connected to said third lower end.

3. A miniature multi-decade balun as described in claim 2, wherein:
said first wire is wound approximately 2 turns around said first leg; and,
said twisted pair is wound approximately 2 turns around said third leg.

4. A miniature multi-decade balun as described in claim 3, wherein:
said 2 turns wound of said first wire is substantially centered on said first leg and spaced with a gap of approximately 2 wire diameters between said turns; and,
said 2 turns wound of said twisted pair is substantially centered on said third leg and spaced with a gap of approximately 2 wire diameters between said turns.

5. A miniature multi-decade balun as described in claim 1, wherein said miniature binocular core is substantially rectangular in form.

6. A miniature multi-decade balun as described in claim 1, wherein said miniature binocular core is secured to a substrate comprising a 6 lead header.

7. A miniature multi-decade balun as described in claim 6, wherein said miniature binocular core is secured to said substrate by means of a chipbonder adhesive.

8. A miniature multi-decade balun as described in claim 6, wherein said 6 lead header has a conductive bonding pad for each lead and said wires are welded to said conductive bonding pads.

9. A miniature multi-decade balun as described in claim 1, wherein a substantially planar lid is secured on top of said miniature binocular core, thereby providing means for handling by standard robotic pick and place machinery.

10. A miniature multi-decade balun as described in claim 1, wherein the bandwidth of said balun is at least 10 MHz to 6000 MHz.

11. A miniature multi-decade balun as described in claim 1, wherein said balun has a substantially flat insertion loss and a low return loss.

12. A miniature multi-decade balun as described in claim 1, wherein said twisted pair comprises 36 gauge wire twisted to 20 twists per inch with a twist deviation of no more than 5 percent after being wound on said third leg.

13. A miniature multi-decade balun as described in claim 1, wherein non-coil portions of said first wire, non-coil portions of said twisted pair, and said non-twisted end portions of said twisted pair are configured to minimize parasitic inductance.

14. A miniature multi-decade balun as described in claim 1, wherein said wires are 36 gauge wire.

15. A miniature multi-decade balun as described in claim 1, wherein the overall assembled dimensions are no greater than approximately 0.16 inch×0.15 inch×0.16 inch.

16. A miniature multi-decade balun as described in claim 1, wherein said miniature binocular core is made from high permeability ferrite material.

17. A miniature multi-decade balun comprising:
  a substantially rectangular, high-permeability ferrite miniature binocular core having a first leg, a second leg, a third leg, a first aperture and a second aperture;
  said second leg being a center leg of said binocular core;
  a first wire being a 36 gauge wire having a first upper end and a first lower end;
  a twisted pair comprising a 36 gauge second wire and a 36 gauge third wire twisted with approximately 20 twists per inch;
    said twisted pair having a center twisted portion and two non-twisted end portions, said non-twisted end portions of said twisted pair being configured to minimize parasitic inductance;
  said first wire being wound approximately 2 turns around the center of said first leg and through said first aperture;
  said twisted pair being wound approximately 2 turns around the center of said third leg and through said second aperture;
  said twists having a deviation of no more than 5 percent after being wound on said third leg;
  said 2 turns wound of said first wire being spaced with a gap of approximately 2 wire diameters between said turns;
  said 2 turns wound of said twisted pair being spaced with a gap of approximately 2 wire diameters between said turns;
  said second wire having a second upper end and a second lower end;
  said third wire having a third upper end and a third lower end;
  said first lower end being electrically connected to said second upper end and said first upper end being electrically connected to said third lower end;
  said miniature binocular core being secured by means of a chipbonder adhesive to a substrate comprising a 6 lead header;
  said 6 lead header having a conductive bonding pad for each lead and said wires being welded to said conductive bonding pads;
  a substantially planar lid being secured on top of said binocular core, thereby providing means for handling by standard robotic pick and place machinery; and,
  the overall assembled dimensions of said balun being no greater than approximately 0.16 inch×0.15 inch×0.16 inch.

18. A miniature multi-decade balun as described in claim 17, wherein the bandwidth of said balun is at least 10 MHz to 6000 MHz.

19. A miniature multi-decade balun as described in claim 18, wherein said balun has a substantially flat insertion loss and a low return loss.

* * * * *